United States Patent [19]
Wolff et al.

[11] 3,952,324
[45] Apr. 20, 1976

[54] SOLAR PANEL MOUNTED BLOCKING DIODE

[75] Inventors: George Wolff, Los Angeles; Gilbert R. Brooks, Granada Hills; Thomas C. Eakins, Palos Verdes Peninsula, all of Calif.

[73] Assignee: Hughes Aircraft Company, Culver City, Calif.

[22] Filed: Jan. 2, 1973

[21] Appl. No.: 320,408

[52] U.S. Cl. ............ 357/19; 357/72; 357/73; 357/17; 250/510; 136/89
[51] Int. Cl. ............ H01l 11/00; H01l 15/00
[58] Field of Search ............ 317/234, 3, 3.1, 235, 317/27; 250/510; 29/572; 136/89

[56] References Cited
UNITED STATES PATENTS

| | | | |
|---|---|---|---|
| 3,489,615 | 1/1970 | Mann et al. | 317/235 N |
| 3,489,615 | 1/1970 | Mann et al. | 317/235 N |
| 3,518,494 | 6/1970 | James | 317/234 |
| 3,529,217 | 9/1970 | Van Santen | 317/234 N |
| 3,532,551 | 10/1970 | Scott | 317/235 N |
| 3,546,542 | 12/1970 | Riel et al. | 317/235 N |
| 3,591,420 | 7/1971 | Streed | 317/235 N |
| 3,616,528 | 11/1971 | Hasbach | 317/235 N |
| 3,620,847 | 11/1971 | Wise | 317/235 N |
| 3,690,953 | 9/1972 | Wise | 317/235 N |
| 3,700,497 | 10/1972 | Epifano et al. | 317/234 E |
| 3,743,847 | 7/1973 | Boland | 317/235 N |
| 3,769,091 | 10/1973 | Leinkram et al. | 317/235 N |
| 3,780,424 | 12/1973 | Forestieri et al. | 317/235 N |

FOREIGN PATENTS OR APPLICATIONS

| | | | |
|---|---|---|---|
| 1,320,775 | 2/1963 | France | 317/235 N |

Primary Examiner—Andrew J. James
Attorney, Agent, or Firm—John Holtrichter, Jr.; W. H. MacAllister

[57] ABSTRACT

An isolation or blocking diode for mounting alongside solar cells in solar cell panels such as used in flexible roll-up, rigid flat and cylindrical arrays, the diode having the thickness and shape of adjacent solar cells and functioning to prevent such problems as total solar panel failure in the event of shorts developing in a single solar cell group and a major power loss in case of partial shadowing of the panel.

31 Claims, 8 Drawing Figures

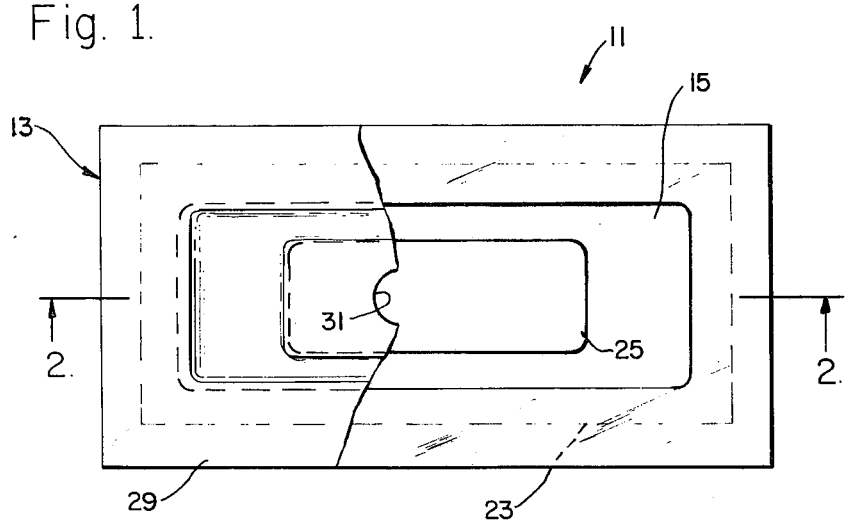
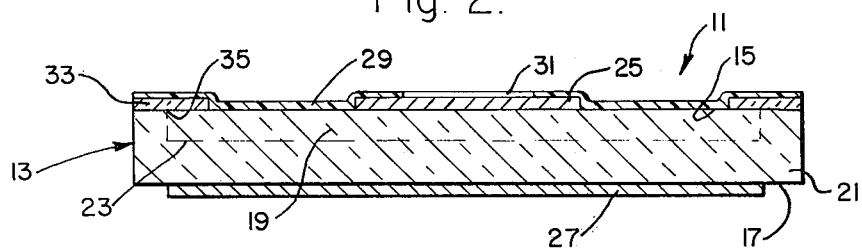
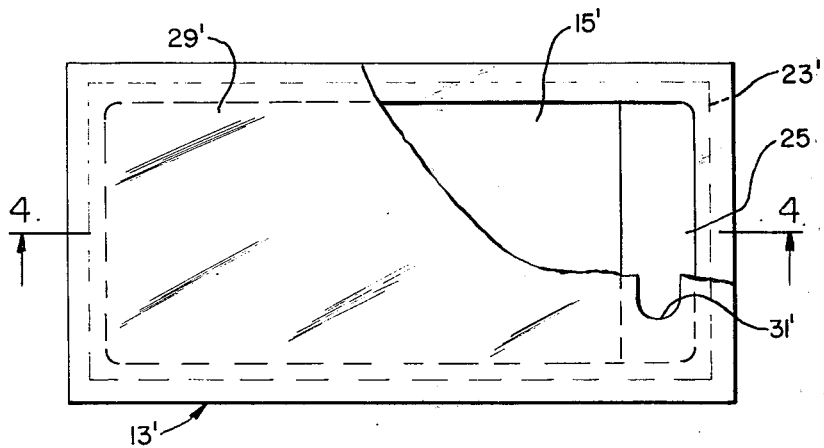
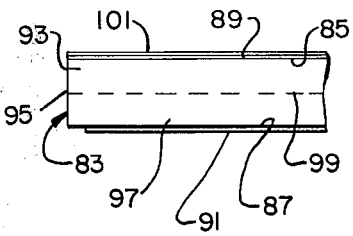
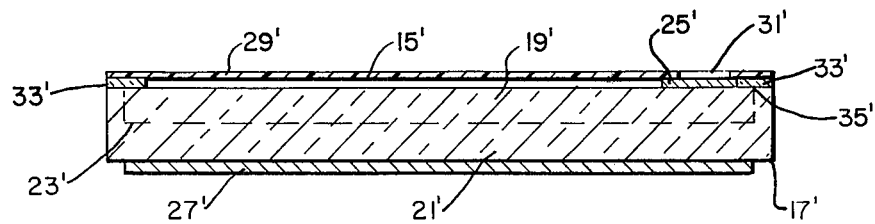

SOLAR PANEL MOUNTED BLOCKING DIODE

BACKGROUND OF THE INVENTION

1. Field of the Invention

This invention relates generally to electrical power generating systems for spacecraft and more particularly to solar cell panel systems.

2. Description of the Prior Art

The performance of practically all spacecraft is limited to a great degree by the amount of electrical power that is available during flight. The most efficient power source has been found to be the conversion of sunlight into an electric current by an array of photo-voltaic or solar cells. In early models, the exterior surface of a spacecraft was usually covered with solar cell array sections which were size-limited by the spacecraft dimensions and efficiency-limited by shadowing and the effects of angular solar incidence.

As the size of spacecraft increased, the volume available for power-consuming pay loads increased as the cube of the diameter ($V=4/3 \pi r^3$), while the surface area went up only as the square ($A=4\pi r^2$). Accordingly, electrical power availability from surface-mounted solar cell arrays become less and less for each unit of pay load volume as the size of the craft increased.

A solution to this problem of improving the solar cell array electrical output was found to increase the array area by the use of a folded or rolled-up array which is mechanically deployed or unfurled after the spacecraft was placed in its operational orbit or trajectory. This scheme has proved to be practical in the zero-g environment of space since such an extendable array can be designed with low weight and small power requirements. It is also desirable that the array be retractable for periods of power flight associated with course correction maneuvers, docking operations, and during the disposal of spacecraft waste to prevent solar cell contamination.

The solar cells in the above-described deployable arrays and also in fixed arrays are typically mounted in panel systems wherein two or three adjacent rows of a plurality of series-connected solar cells are connected in parallel. The series-parallel groups are then connected via appropriate bus bars to the spacecraft power utilization and battery charging systems. Nearly all of these solar cell panel systems use diodes connected in series between each solar cell group and a solar cell bus bar to prevent total panel failure in event of shorts developing in a single solar cell string in a group, and to prevent major power loss in case of partial shadowing of the panel. Also, these diodes help prevent battery discharge through the panel when it is in eclipse, and help prevent local heating effects due to shadows or cell output anomalies. Conventional diodes have been used for this "blocking" purpose and are generally cylindrical in shape and, on rigid flat solar cell panels and cylindrical arrays, the large diameter of the diodes compared to the thickness of the solar cell cover glass has been accommodated by installing the diodes in holes drilled in the substrates.

In fixed cylindrical arrays comprising the craft's exterior surface, the mounting of the diodes in holes presents no serious problem. However, in the more desirable-larger surface-rigid fixed and foldable panel arrays, these holes present a serious structural weakness since they are usually aligned in a row at the end of the solar cell groups adjacent the junction of the panels and the main body of the spacecraft where structural loads are concentrated.

On a flexible roll-up solar array, which typically may have a 2 mil substrate and a 13 to 14 mil thick solar cell/cover glass, the large diameter diodes present major design problems. One solution has been to mount the diodes in holes drilled in the drum or take-up roller of the roll-up array and run isolated bus bars from each panel group to the drum where they are connected to diodes mounted in a heatsink.

Blocking diodes are especially necessary in a roll-up array where part of the array is retracted (i.e., rolled up on the drum) and part of the array is illuminated. The retracted section will act as an electrical load to the illuminated part unless the retracted section is blocked off by diodes. If it is not blocked off, current leaks through the retracted, roll-up sections will cause a temperature rise therein and they will accept more current, which further raises their temperature — permitting still further increase in leakage current. These phenomena could continue until cell damage occurs and/or the retracted sections act as a dead short to the rest of the current-producing panel. It can thus be seen that without the blocking diodes, the output of the entire panel might be lost.

As roll-up or thin solar panels become larger and more complex by the addition of panel regulators, for example, the prior art techniques of using conventional diodes become cumbersome, the number of isolated bus bars increase, and the area available for heatsinking of diodes is restricted. Accordingly, it should be evident that a technique which would provide the necessary diode protection while eliminating the need for heatsinks, allow maximum usage of diode isolation, and minimize the need for numerous long isolated bus bars would constitute a significant advancement of the art.

SUMMARY OF THE INVENTION

In view of the foregoing factors and conditions characteristic of the prior art, it is a primary object of the present invention to provide an improved technique for preventing total solar panel failure caused by a shorted solar cell group and preventing a major power loss to a spacecraft in the case of partial shadowing of a solar cell panel.

It is another object of the present invention to provide a simplified solar cell system that eliminates the need for a diode radiator.

It is still another object of the present invention to provide a solar cell system when solar cell groups, along with blocking diodes, are fabricated in the same soldering or welding operation.

It is yet another object of the present invention to provide a solar cell system that allows solar cell groups to be tested individually through all production phases including testing after final solar cell panel assembly.

It is a further object of the present invention to provide a solar cell system wherein blocking diodes have the same size and shape as the solar cells mounted adjacent thereto.

In accordance with an embodiment of the present invention, a solar cell panel system includes a solar cell panel including a panel substrate. A plurality of relatively thin solar cells having relatively broad upper and lower surfaces are mounted adjacent one another in relatively closely spaced relation on the substrate with their lower surfaces adjacent the substrate. The solar cells are electrically interconnected to form groups of solar cells in an electrical arrangement to provide a desired voltage and current characteristic. The invention also includes relatively thin blocking diodes having relatively broad upper and lower surfaces, the diodes being disposed adjacent the solar cells in relatively closely spaced relations and mounted on the substrate with their lower surfaces adjacent the substrate. At least one of the diodes is connected in series with each of the groups in the arrangement to prevent total solar panel failure in the event of shorts developing in the solar cell groups and to prevent major power loss in case of partial shadowing of the solar cell panel.

A blocking diode used in the solar cell panel system may include a relatively thin semiconductor wafer having parallel and relatively broad upper and lower surfaces and at least two differently doped regions defining a junction therebetween. A first of the regions extends inwardly a predetermined distance from the upper surface and is bounded peripherally at the upper surface and internally by a second of the regions to define a planar junction configuration. A first contact or electrode is disposed on the upper surface and makes ohmic contact only with the first region, while a second electrode is disposed on the lower surface of the wafer and makes ohmic contact with the second region. The blocking diode also includes cover means disposed over the upper surface for blocking solar illumination from penetrating the wafer and affecting the junction.

Further, in order to prevent leakage across the junction at the upper surface of the wafer, sealing means may be disposed on the upper surface in contact with the first and second regions at the peripheral boundary of the first region.

The features of the present invention which are believed to be novel are set forth with particularity in the appended claims. The present invention, both as to its organization and manner of operation, together with further objects and advantages thereof, may best be understood by making reference to the following description, taken in conjunction with the accompanying drawings, in which like reference characters refer to like elements in the several views.

BRIEF DESCRIPTION OF THE DRAWINGS

FIG. 1 is a plan view, partially broken away, of a blocking diode constructed in accordance with the present invention;

FIG. 2 is a sectional view of the diode of FIG. 1 taken along line 2—2;

FIG. 3 is a plan view, partially broken away, of a blocking diode in accordance with another embodiment of the present invention;

FIG. 4 is a sectional view of the diode of FIG. 3, taken along line 4—4;

FIG. 8 is a partial side elevational view of a blocking diode constructed in accordance with still another embodiment of the present invention.

DESCRIPTION OF THE PREFERRED EMBODIMENT

Figure 5:
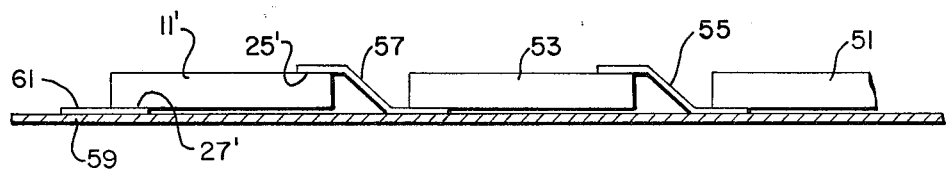
FIG. 5 shows on an enlarged scale a partial elevation of a blocking diode mounted on a solar panel substrate adjacent a plurality of substrate-mounted solar cells.

Referring now to the drawings and more particularly to FIGS. 1 and 2, there is shown an isolation or blocking diode 11 for use in and directly mounted on solar cell panels, such as used in conventional flexible roll-up, rigid flat and cylindrical solar panel arrays. The diode 11 here comprises a relatively thin semiconductor wafer 13 having parallel and relatively broad upper and lower surfaces 15 and 17 and having at least two differently doped regions 19 and 21 defining a junction therebetween as depicted by a dashed line 23. The first region 19 extends inwardly a predetermined distance from the upper surface 15 and is bounded peripherally at the upper surface and internally by the second region 21. A first electrically conductive electrode 25 is disposed on the upper surface and makes ohmic contact only with the first region 19, while a second electrode 27 is disposed on the lower surface 17 and makes only contact with the second region 21. Disposed over the upper surface 15 (and the first electrode 25) is a solar illumination-blocking bonded aluminized plastic cover 29, for example, so that such illumination cannot affect the junction. The cover 29 in this embodiment is preferably of a polytetrafluoroethylene material, that is a fully fluorinated copolymer of hexafluoropropylene and tetrafluoroethylene. It is provided with an electrode access hole 31 and it also acts to give bombarding space particulate radiation protection as well as desirable thermal control characteristics, such as low solar absorptivity ($\alpha$) with high thermal emissivity ($\epsilon$).

The wafer 13 may be of any semiconductor material such as silicon, for example, and it may be fabricated from a pre-doped bulk crystal, either n or p so as to provide the planar junction configuration shown. The electrodes 25 and 27 may be deposited silver-titanium (AgTi) or they may be of aluminum, the latter being highly conductive, easily weldable, reliable and having high environmental durability.

The diode 11 is necessarily dimensioned in a thinflat configuration to conform to the general size and shape of typical solar cells. The diode 11 is distinctively different in appearance from a standard solar panel blocking diode which is tubular in shape and much thicker than a solar cell, and as previously noted, the configuration of the latter diode presents an obstacle to mounting on thin, folding, or roll-up solar cell panels. It can thus be seen that the diode 11 may be mounted immediately adjacent groups of solar cells and electrically connected in series with different groups of such cells so that separate long, insulated bus bars are no longer required. For example, the wafer 13 may be only 8 mil thick and have length and width dimensions as little as 1 × 2 cm.

The size and shape of the diode 11 is also important because it permits the blocking diode to be treated as if it were another solar cell with regard to automatic machine or manual assembly of solar cell groups. The large junction area aids in heat dissipation, which is important since diodes on a lightweight flexible array will have limited thermal coupling and must dissipate heat almost completely by radiation.

The diode 11 may be mounted on a solar panel substrate in any conventional manner, but the electrode material must be taken into consideration. Thus, silver-titanium electrodes or contacts are often employed for use with soldered solar cell groups, while aluminum, as another candidate electrode material, may be used for welded solar cell groups. However, since aluminum acts as a p type dopant, heavily doped n$^+$ material should be used as the basic substrate in order to minimize the effect of introducing an unwanted Schottky barrier on the backside (the n side).

Also shown in FIGS. 1 and 2, between the upper surface 15 and the cover 29, is a sealing strip 33 of thermal diffused glass, for example, which is disposed in contact with both doped regions at the peripheral boundary 35 of the first region 19 to prevent leakage across the junction 23 at the upper surface 15. The strip 33 may extend downwardly along the side of the wafer 13 or it may be etched off as herein illustrated.

The area dimension and the location of the first doped region and the upper or first electrode 25 may be changed as required for a particular application, as shown in FIGS. 3 and 4, for example. Here, the junction 23' extends closer to the edge of the wafer 13' and the first electrode 25' has a much smaller area and is located adjacent one end of the wafer alongside the glass seam 33'. This configuration more closely resembles the electrode location of typical solar cells and provides for ease of connection to the cells. In this embodiment, a silvered or aluminized fuzed silica cover 29' is bonded in the diode 11' to perform the same function as the cover 29 in the first described embodiment of the invention.

A simplified illustration of such diode-to-cell connection is presented in FIG. 5 wherein there is shown a pair of solar cells 51 and 53 serially connected by means of a Z-shaped metal conductor 55, and a blocking diode 11' serially connected to the cell 53 by another Z conductor 57. The cells and the diode are shown mounted on a solar panel substrate 59 by any conventional technique and the lower or second contact or electrode 27' is electrically connected to the utilization circuitry of a spacecraft by means of an insulated bus bar 61.

Figure 6:
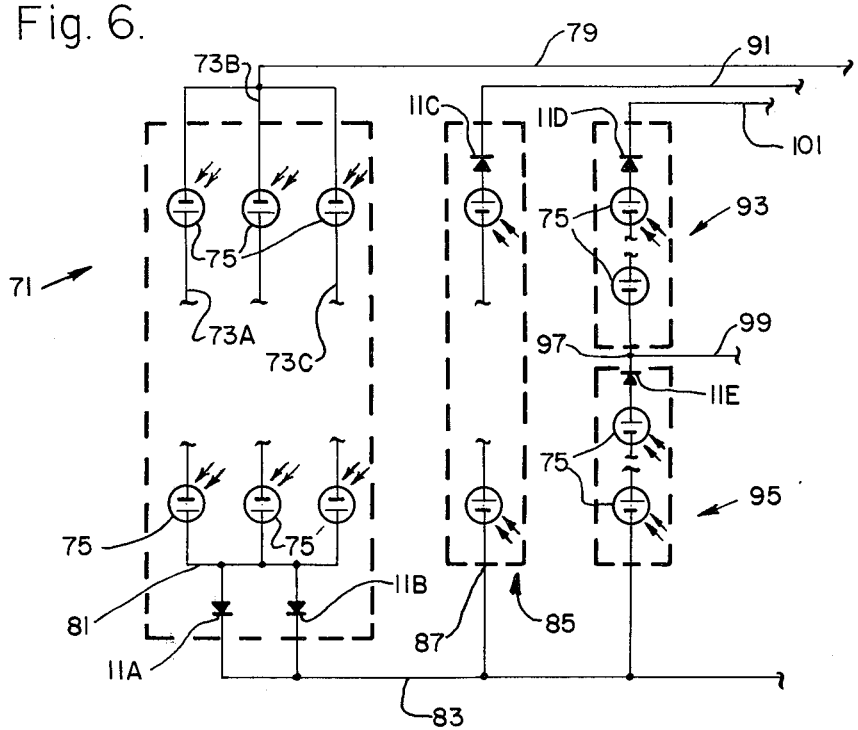
FIG. 6 is a schematic illustration of various typical electrical interconnection arrangement making up different groups of solar cells, each group being provided with one or more isolation or blocking diodes in accordance with the present invention.

As explained above, the solar panel blocking diodes are connected in series with groups of solar cells for such reasons as preventing total solar cell panel failure in the event of a short developing in a single group, and preventing major power loss in case of partial shadowing of the panel. FIG. 6 schematically illustrates several, of many, possible solar cell group arrangements, each having one or more panel-mounted blocking diodes 11 electrically connected in series with the group and its utilization circuitry.

In this figure, there is shown a first group 71 having three parallel solar cell strings 73A – C, each string comprising any desired number of series-connected cells 75. One end 77 of the group 71 is connected directly to a first bus bar 79 while its other end 81 is connected through a pair of panel-mounted blocking diodes 11A and 11B to a common or return bus bar 83. The number of diodes used will be determined by considerations that are well within the knowledge of one skilled in the art.

Another typical solar cell grouping comprising a single string of cells 75 is designated 85 in FIG. 6. Its lower end 87 is directly connected to the bus bar 83 and its upper end 89 is connected through a diode 11C to its bus bar 91. A typical variation of a single string arrangement is also illustrated in FIG. 6. Here, series strings 93 and 95 are jointed at a common junction 97 with a bus bar 99. The upper string 93 is connected to the junction 97 and is provided with a panel-mounted diode 11D leading to a bus bar 101. The lower string 95 also includes a series-connected isolation or blocking diode 11E and is serially connected between the common bus bar 83 and the junction 97.

Figure 7:
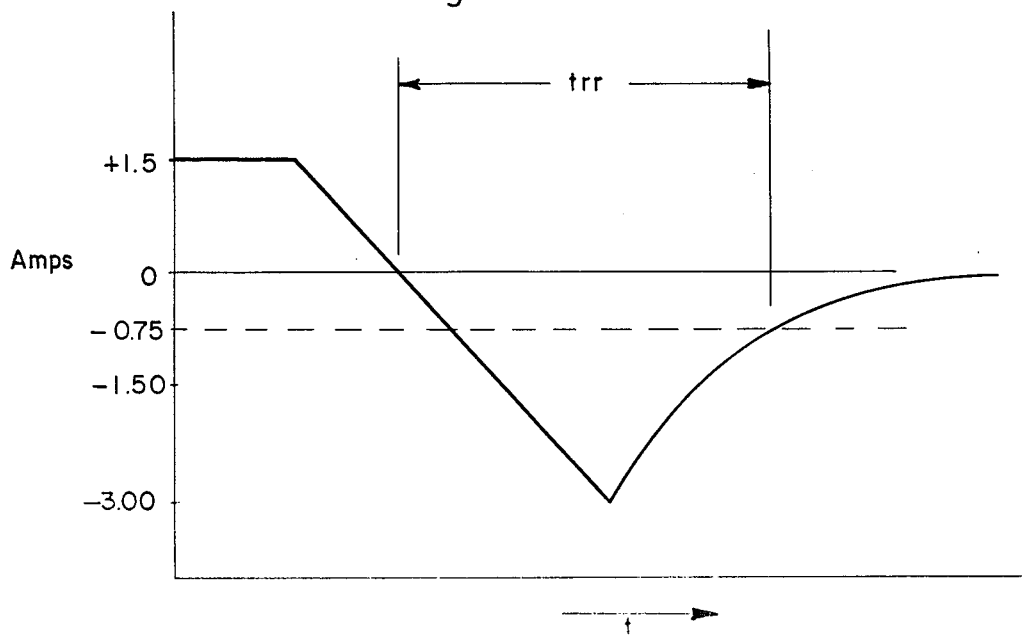
FIG. 7 is a graphical representation showing diode recovery time to sudden voltage reversor.

Solar panel-mounted blocking diodes of the type described may typically exhibit a forward voltage drop of 1.0 volt at 3 amperes, 25° C with a reverse voltage characteristic of 200 volts at considerably less than 1 milliampere. In certain applications, recovery time is of importance and the graph shown in FIG. 7 illustrates a typical recovery which may have a small trr of about $2\mu$ sec.

Referring now to FIG. 8, there is shown a partial view of still another embodiment of the present invention. Here, a blocking diode 81 comprises a relatively thin semiconductor wafer 83 having parallel upper and lower planar surfaces 85 and 87, respectively. The wafer 83 is provided with upper and lower electrodes 89 and 91 of conductive material, which electrodes perform functions similar to like elements in previously described embodiments. The wafer 83 further is provided with a first doped region 93 extending inwardly a predetermined distance from the upper surface 85, this region being peripherally bounded by the wafer's sides 95 and internally by a second region 97 having a different dopant defining a junction 69 therebetween. Although not shown in FIG. 8, a sealing element may be disposed by any conventional process along the sides 95 of the wafer 83 over the edge 99 of the junction 69 to help prevent surface leakage between the two regions. As in all the other embodiments, a solar illumination-blocking cover 101 is bonded or otherwise attached to the diode 81 over the upper surface 85.

It should be evident from the foregoing that solar panel environment conditions require the blocking diodes to have capabilities very similar to solar cells. Essentially this means that these diodes must successfully operate under wide temperature excursions (−180° C to +150° C), that they can be interconnected with a group of solar cells, and that they can possibly be bonded to a thin, flexible substrate without introducing any structural weakness. These essential characteristics are met by the blocking diodes herein described.

The novel blocking diode configuration simplifies solar cell panel design and significantly reduces its weight by eliminating the need for a diode radiator, and permit the solar cell groups (with blocking diodes included) to be built in the same soldering or welding operation. The invention also allows solar cell groups to be tested individually through all production phases including testing after final panel assembly, and further, it improves solar panel reliability in a cost effective manner.

Although certain materials have been specifically identified, it should be understood that the invention may be constructed and practiced using other materials which have similar desirable characteristics. Also, it should be realized that the particular doping arrangement shown may be reversed to be compatible with the polarization of solar cells in a particular panel system. Further, the invention is not limited to the size and shape of the electrodes and doped regions herein illustrated and various changes and modifications obvious to one skilled in the art to which the invention pertains are deemed to be within the spirit, scope and contemplation of the invention.

What is claimed is:

1. A blocking diode used in solar cell arrays, comprising:
   a relatively thin semiconductor wafer having parallel and relatively broad upper and lower surfaces and having at least two differently doped regions defining a junction therebetween;
   a first of said regions extending inwardly a predetermined distance from said upper surface and being bounded internally by a second of said regions;
   a first electrode disposed on said upper surface and making ohmic contact only with said first region;
   a second electrode disposed on said lower surface and making ohmic contact with said second region; and
   cover means including a solar energy-reflecting cover having relatively low solar energy absorptivity and relatively high thermal energy emissivity disposed over said upper surface for blocking solar illumination from penetrating said wafer and affecting said junction.

2. The blocking diode according to claim 1, wherein said wafer has sides generally perpendicular to said broad surfaces, and wherein said first region is bounded peripherally by said sides.

3. A blocking diode used in solar cell arrays, comprising:
   a relatively thin semiconductor wafer having parallel and relatively broad upper and lower surfaces and having at least two differently doped regions defining a junction therebetween, a first of said regions extending inwardly a predetermined distance from said upper surface and being bounded peripherally at said upper surface and internally by a second of said regions;
   a first electrode disposed on said upper surface and making ohmic contact only with said first region;
   a second electrode disposed on said lower surface and making ohmic contact with said second region; and
   cover means including a solar energy-reflecting cover having relatively low solar energy absorptivity and relatively high thermal energy emissivity disposed over said upper surface for blocking solar illumination from penetrating said wafer and affecting said junction.

4. The blocking diode according to claim 3, wherein said first and second regions define a planar junction.

5. The blocking diode according to claim 4, wherein said cover means includes a first electrode-access aperture therein.

6. The blocking diode according to claim 5, wherein said cover means includes a bonded aluminized polytetrafluoroethylene cover.

7. The blocking diode according to claim 5, wherein said cover means includes an aluminized fuzed silica cover.

8. The blocking diode according to claim 5, wherein said cover means includes a silvered fuzed silica cover.

9. A blocking diode for use in solar cell arrays comprising:
   a relatively thin semiconductor wafer having parallel and relatively broad upper and lower surfaces and having two differently doped regions defining a junction therebetween, a first of said regions extending inwardly a predetermined distance from said upper surface and being bounded peripherally at said upper surface and internally by a second of said regions;
   a first electrode disposed on said upper surface and making ohmic contact only with said first region;
   a second electrode disposed on said lower surface and making ohmic contact with said second region;
   sealing means disposed on said upper surface and in contact with said first and second regions at the peripheral boundary of said first region for preventing leakage across said junction at said upper surface; and
   cover means including a solar energy-reflecting cover having relatively low solar energy absorptivity and relatively high thermal energy emissivity disposed over said upper surface and said sealing means for blocking light energy from penetrating said wafer and affecting said junction.

10. The blocking diode according to claim 9, wherein said sealing means includes a sealing strip of thermal diffused glass.

11. The blocking diode according to claim 10, wherein said first and second regions define a planar junction.

12. The blocking diode according to claim 11, wherein said cover means includes a first electrode-access aperture therein.

13. The blocking diode according to claim 12, wherein said cover means includes a bonded aluminized polytetrafluoroethylene cover.

14. The blocking diode according to claim 12, wherein said cover means includes an aluminized fuzed silica cover.

15. The blocking diode according to claim 12, wherein said cover means includes a silvered fuzed silica cover.

16. A solar cell panel system including a plurality of solar cell groups and serially connected blocking diodes, characterized in that said diodes comprise:
   a relatively thin semiconductor wafer having parallel and relatively broad upper and lower surfaces and having at least two differently doped regions defining a junction therebetween; a first of said regions extending inwardly a predetermined distance from said upper surface and being bounded peripherally at said upper surface and internally by a second of said regions;
   a first electrode disposed on said upper surface and making ohmic contact only with said first region;
   a second electrode disposed on said lower surface and making ohmic contact with said second regions; and
   cover means including a solar energy-reflecting cover having relatively low solar energy absorptivity and relatively high thermal energy emissivity disposed over said upper surface for blocking solar illumination from penetrating said wafer and affecting said junction.

17. The system according to claim 16, wherein said first and second regions define a planar junction.

18. The system according to claim 17, wherein said cover means includes a first electrode-access aperture therein.

19. The system according to claim 18, wherein said cover means includes a bonded aluminized polytetrafluoroethylene cover.

20. The system according to claim 18, wherein said cover means includes an aluminized fuzed silica cover.

21. The system according to claim 18, wherein said cover means includes a silvered fuzed silica cover.

22. The system according to claim 16, also comprising sealing means disposed on said upper surface and in contact with said first and second regions at the peripheral boundary of said first region for preventing leakage across said junction at said upper surface.

23. The system according to claim 2 wherein said sealing means includes a sealing strip of thermal diffused glass.

24. A solar cell panel system comprising:
a solar cell panel including a panel substrate;
a plurality of relatively thin solar cells having relatively broad upper and lower surfaces, said solar cells being mounted adjacent one another in relatively closely spaced relation on said substrate with their said lower surfaces adjacent said substrate, said solar cells being electrically interconnected to form groups of said solar cells, said groups being connected in an arrangement to provide a desired voltage and current characteristic; and
relatively thin blocking diodes having relatively broad upper and lower surfaces, said diodes being disposed adjacent said solar cells in relatively closely spaced relation and mounted on said substrate with their said lower surfaces adjacent said substrate, at least one of said diodes being electrically connected in series with each of said groups in said arrangement, said diodes including a relatively thin semiconductor wafer having parallel and relatively broad upper and lower surfaces and having at least two differently doped regions defining a junction therebetween, a first of said regions extending inwardly a predetermined distance from said upper surface and being bounded internally by a second of said regions, each of said diodes including a first electrode disposed on said upper surface and making ohmic contact only with said first region and the second electrode disposed on said lower surface and making ohmic contact with said second region, each of said diodes further including cover means including a solar energy-reflecting cover having relatively low solar energy absorptivity and relatively high thermal energy emissivity disposed over said upper surface for blocking solar illumination from penetrating said wafer and affecting said junction.

25. The system according to claim 24, wherein said wafer has sides generally perpendicular to said broad surfaces, and wherein said first region is bounded peripherally by said sides.

26. The system according to claim 24, wherein said first region is bounded peripherally at said upper surface by said second region to define a planar junction.

27. The system according to claim 24, wherein said cover means includes a first electrode-access aperture therein.

28. The system according to claim 27, wherein said cover means includes a bonded aluminized polytetrafluoroethylene cover.

29. The system according to claim 27, wherein said cover means includes an aluminized fuzed silica cover.

30. The system according to claim 27, wherein said cover means includes a silvered fuzed silica cover.

31. The system according to claim 24 also comprising sealing means disposed on said upper surface of said wafer and in contact with said first and second regions at the peripheral boundary of said first region for preventing leakage across said junction at said upper surface, said sealing means including a sealing strip of thermal diffused glass.

* * * * *